(12) United States Patent
Liu et al.

(10) Patent No.: US 10,059,841 B2
(45) Date of Patent: Aug. 28, 2018

(54) RESIN COMPOSITION AND USES OF THE SAME

(71) Applicant: TAIWAN UNION TECHNOLOGY CORPORATION, Chupei, Hsinchu County (TW)

(72) Inventors: Shur-Fen Liu, Chupei (TW); Meng-Huei Chen, Chupei (TW)

(73) Assignee: TAIWAN UNION TECHNOLOGY CORPORATION, Chupei, Hsinchu County (TW)

( * ) Notice: Subject to any disclaimer, the term of this patent is extended or adjusted under 35 U.S.C. 154(b) by 368 days.

(21) Appl. No.: 14/808,393

(22) Filed: Jul. 24, 2015

(65) Prior Publication Data
US 2016/0280913 A1 Sep. 29, 2016

(30) Foreign Application Priority Data
Mar. 27, 2015 (TW) .............. 104109961 A

(51) Int. Cl.
| | | |
|---|---|---|
| *C08L 71/12* | (2006.01) | |
| *H05K 3/00* | (2006.01) | |
| *C08J 5/24* | (2006.01) | |
| *B32B 5/02* | (2006.01) | |
| *B32B 5/00* | (2006.01) | |
| *B32B 27/00* | (2006.01) | |

(52) U.S. Cl.
CPC .............. *C08L 71/126* (2013.01); *B32B 5/00* (2013.01); *B32B 5/02* (2013.01); *B32B 27/00* (2013.01); *C08J 5/24* (2013.01); *H05K 3/0011* (2013.01); *B32B 2260/046* (2013.01); *C08J 2371/12* (2013.01); *C08L 2201/02* (2013.01); *C08L 2312/00* (2013.01)

(58) Field of Classification Search
CPC .............................. C08L 71/126; C08L 71/12
See application file for complete search history.

(56) References Cited

U.S. PATENT DOCUMENTS

| | | | | |
|---|---|---|---|---|
| 5,218,030 A * | 6/1993 | Katayose | .............. | C08F 283/08 428/422.8 |
| 7,495,047 B2 * | 2/2009 | Peters | .................. | C08K 5/0008 524/136 |
| 2006/0041086 A1 * | 2/2006 | Birsak | ............... | C08F 222/1006 525/391 |
| 2009/0203279 A1 | 8/2009 | Mori et al. | | |
| 2013/0252003 A1 | 9/2013 | Liu | | |
| 2014/0057086 A1 * | 2/2014 | Tietze | ........................ | C09J 4/00 428/196 |
| 2014/0255711 A1 | 9/2014 | Chen et al. | | |

FOREIGN PATENT DOCUMENTS

| | | |
|---|---|---|
| CN | 103228703 A | 7/2013 |
| CN | 103319877 A | 9/2013 |
| CN | 104031377 A | 9/2014 |
| JP | 2011001473 A | 1/2011 |
| TW | I448509 B | 8/2014 |
| TW | I468465 B | 1/2015 |

OTHER PUBLICATIONS

Taiwanese Office Action for counterpart Application No. TW201124478A dated Nov. 17, 2015.
SIPO First Office Action corresponding to CN Application No. 201510159730.0; dated Nov. 3, 2017.

* cited by examiner

Primary Examiner — Monique Jackson
(74) Attorney, Agent, or Firm — Cantor Colburn LLP

(57) ABSTRACT

A resin composition is provided. The resin composition comprises:

(a) a resin of formula (I):

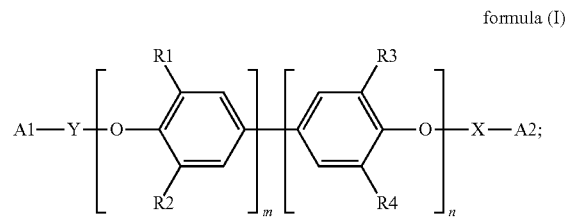

and (b) a solvent, wherein, X, Y, R1 to R4, A1, A2, m and n are as defined in the specification.

12 Claims, No Drawings

RESIN COMPOSITION AND USES OF THE SAME

CROSS REFERENCE TO RELATED APPLICATIONS

The present invention claims priority under 35 U.S.C. § 119 to Taiwan Patent Application No. 104109961 filed on Mar. 27, 2015, the entire content of which is incorporated herein by reference.

BACKGROUND OF THE INVENTION

Field of the Invention

The present invention relates to a resin composition, especially a resin composition comprising a specific polyphenylene ether resin, and prepreg and laminate prepared using the same.

Descriptions of the Related Art

Printed circuit boards (PCBs) are circuit substrates that are used for electronic devices to load other electronic components and to electrically connect the components to provide a stable circuit working environment. One kind of conventional printed circuit board is a copper clad laminate (CCL), which is primarily composed of resin(s), reinforcing material(s) and copper foil(s). Conventional resins include epoxy resins, phenolic resin, polyamine formaldehyde resins, silicone resins or polytetrafluoroethylene resins; and conventional reinforcing materials include glass fiber cloths, glass fiber mats, insulating papers or linen cloths.

In general, a printed circuit board can be prepared by using the following method: immersing a reinforcing material, such as a glass fiber fabric into a resin (such as epoxy resin), and curing the immersed glass fiber fabric into a half-hardened state, i.e., B-stage, to obtain a prepreg; superimposing certain layers of the prepregs and superimposing a metal foil on at least one external surface of the superimposed prepregs to provide a superimposed object; hot-pressing the superimposed object, i.e., C-stage, to obtain a metal clad laminate; etching the metal foil on the surface of the metal clad laminate to form a defined circuit pattern; and finally, drilling a plurality of holes on the metal clad laminate and plating these holes with a conductive material to form via holes to accomplish the preparation of the printed circuit board.

Recently, laminates for PCB substrates are mostly prepared by using epoxy resins. It is known that laminates prepared by using epoxy resins may be provided with proper physicochemical properties such as heat resistance, chemical stability, mechanical strength, etc. However, laminates thus prepared are also provided with a high dielectric constant (Dk), a high dissipation factor (Df), and high water absorption rate, which all lead to the deterioration of the signal transmission quality (e.g., a slow signal transmission rate and signal loss). As a result, the laminates prepared by using epoxy resins are gradually failing to meet the requirements for high frequency and high-speed signal transmission for smaller, lighter, and thinner electronic products.

Polyphenylene ether resin is another resin material for preparing laminates. In general, polyphenylene ether resin is poor in heat resistance (high temperature stability) but has excellent electrical properties and good chemical resistances (e.g., corrosion resistance, acid and alkali resistance), and thus, is usually used in combination with epoxy resin to improve electrical properties. However, in practical use, the compatibility between polyphenylene ether resin and epoxy resin is poor due to the difference in the polarity of their chemical structures. The incompatibility makes it difficult to process the resin composition and thus, limits the usage of the resin composition, and also makes it difficult to produce the advantage of polyphenylene ether resin in the resin composition well.

In view of this, the present invention provides a polyphenylene-based resin composition comprising a polyphenylene resin with a specific structure. In virtue of the polyphenylene with the specific structure, the resin composition of the present invention offers advantages such as low cost and ease of processing, and the laminate prepared by using the resin composition of the present invention is provided with satisfactory physicochemical properties.

SUMMARY OF THE INVENTION

An objective of the present invention is to provide a resin composition, comprising:
(a) a resin of formula (I)

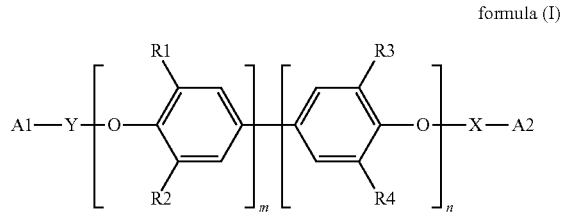

formula (I)

wherein,
X and Y are independently

an alkenyl-containing group or absent, with the proviso that X and Y are not absent at the same time;
R1, R2, R3 and R4 are independently H or substituted or unsubstituted C1-C5 alkyl;
A1 and A2 are independently

and
m and n are independently an integer from 0 to 80, and $1 \leq (m+n) \leq 80$; and
(b) a solvent.

Another objective of the present invention is to provide a prepreg, which is prepared by immersing a substrate into the resin composition described above, and drying the immersed substrate.

Yet another objective of the present invention is to provide a laminate, comprising a synthetic layer and a metal layer, wherein the synthetic layer is made from the prepreg described above.

To render the above objectives, technical features and advantages of the present invention more apparent, the present invention will be described in detail with reference to some embodiments hereinafter.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, unless it is additionally explained, the expressions "a," "the," or the like recited in the specification of the present invention (especially in the claims) should include both the singular and the plural forms. Furthermore, unless it is additionally explained, while describing the constituents in the solution, mixture and composition in the specification, the amount of each constituent is measured based on the solid content, i.e., regardless of the weight of the solvent.

One feature of the present invention lies in using a polyphenylene ether resin with a specific structure as shown in formula (I). The polyphenylene ether resin with the specific structure offers advantages such as low cost and ease of processing (easy to apply) when applied in a resin composition. The laminate material prepared thereby not only has excellent electrical properties and chemical resistance, but also has excellent heat resistance, making all the physicochemical properties of the laminate satisfactory.

Specifically, the resin composition of the present invention comprises (a) a resin of the following formula (I) and (b) a solvent.

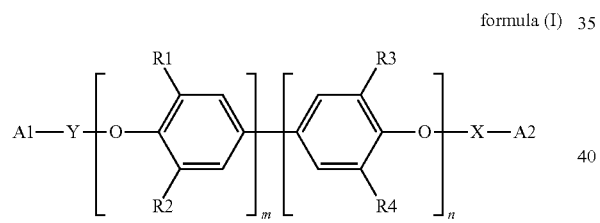

formula (I)

In formula (I), X and Y are independently

an alkenyl-containing group or absent, with the proviso that X and Y are not absent at the same time; R1, R2, R3 and R4 are independently H or substituted or unsubstituted C1-C5 alkyl, for example, methyl, ethyl, n-propyl, isopropyl, n-butyl and the like; A1 and A2 are independently

and m and n are independently an integer from 0 to 80, and 1≤(m+n)≤80, 10≤(m+n)≤60 is preferred. X preferably has a structure of the following formula (II) and Y has a structure of the following formula (III):

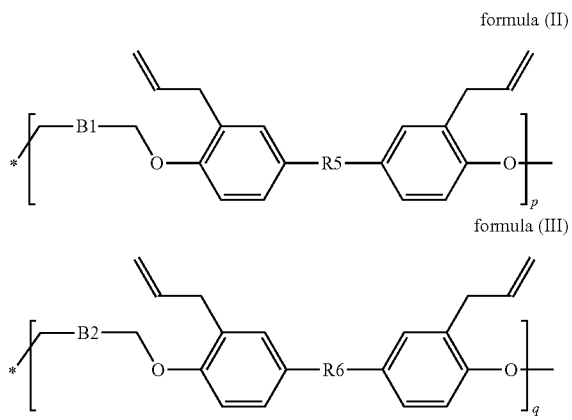

wherein,
* indicates the end connecting oxygen (—O—) of formula (I);
B1 and B2 are independently

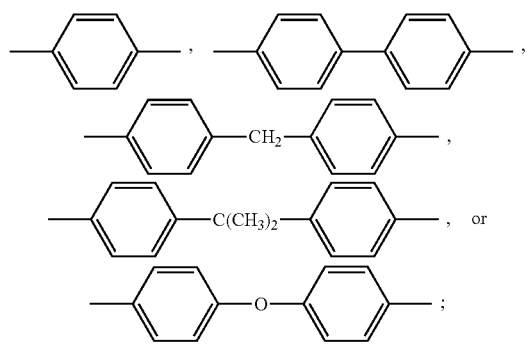

R5 and R6 are independently —O—, —SO$_2$—, or —C(CH$_3$)$_2$—, or absent; and
p and q are independently an integer, and 1≤p+q<20, preferably 1≤p+q<10, and more preferably 1≤p+q<3.

In some embodiments of the present invention, in formula (I), R1, R2, R3 and R4 are —CH$_3$, A1 and A2 are

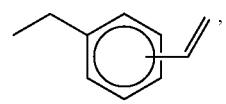

20≤(m+n)≤25, X has a structure of formula (II), Y has a structure of formula (III), and wherein B1 and B2 are

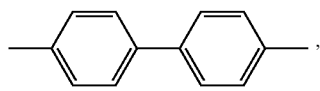

R5 and R6 are absent, and 1≤p+q<3.

The preparation of the above resin (a) of formula (I) is not particularly limited. After persons with ordinary skill in the art review the disclosure of the subject specification, they will be able to prepare the resin (a) without undue experiments in accordance with the disclosed chemical structure by means of using conventional method to prepare polyphenylene ether-based polymer, such as using a condensation reaction of phenol compounds to obtain a polyphenylene ether structure, and performing modification to the polyphenylene ether-based polymer. Since the preparation of the resin (a) is not the main point of the present invention, its detailed description is omitted in the context.

In addition to the resin (a), other thermosetting resin, such as benzooxazine, polystyrene, other polyphenylene ether resin, and the like, can be optionally added into the resin composition of the present invention, such that the properties of the prepared substrate may be further close to the user's demand. In the case of the resin composition further comprising other thermosetting resins, the amount of the other thermosetting resins is not particularly limited, as long as the existing advantages of the resin composition according to the present invention will not be adversely affected. In some embodiments of the present invention, commercial available polyphenylene ether resin (trade name: SA9000, available from Sabic Company) is further added in an amount of 50 parts by weight per 100 parts by weight of the resin (a).

In the resin composition of the present invention, solvent (b) can be any inert solvent which can dissolve (or disperse) but not react with resin (a). Examples of the solvent which can dissolve or disperse the resin (a) include toluene, γ-butyrolactone, methyl ethyl ketone, cyclohexanone, butanone, acetone, xylene, methyl isobutyl ketone, N,N-dimethyl formamide (DMF), N,N-dimethyl acetamide (DMAc), N-methyl-pyrolidone (NMP), and mixtures thereof, but is not limited thereto. In some embodiments of the present invention, a mixture of tolune and γ-butyrolactone is used as the solvent (b). The amount of solvent (b) is not particularly limited as long as the resin (a) can be evenly dissolved or dispersed therein. Generally, to allow the resin composition to comprise sufficient resin component such that the properties of the prepared prepreg and laminate can be ensured, based on 100 parts by weight of resin (a), the amount of the solvent (b) is from 25 parts by weight to 400 parts by weight, preferably from 60 parts by weight to 230 parts by weight, and more preferably from 100 parts by weight to 200 parts by weight.

To enhance the properties of the prepared laminate, the resin composition of the present invention may further add a cross-linking agent capable of forming an interpenetrating polymer network (IPN) to further improve the physicochemical properties and electrical properties of the laminate thus prepared (such as a high Tg, low water absorption, low Dk, and the like). The "IPN structure" means a network structure formed from two or more polymers where the molecular chains interpenetrate each other and crosslink with chemical bonds. Examples of the cross-linking agent includes triallyl isocyanurate (TAIC), bismaleimides having a structure of the following formula (IV) and combinations thereof,

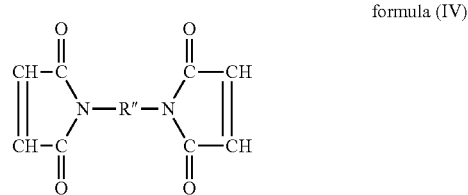

formula (IV)

wherein R" is substituted or unsubstituted methylene, 4,4'-diphenylmethane, m-phenylene, bisphenol A diphenyl ether, 3,3'-dimethyl-5,5'-diethyl-4,4'-diphenyl methane, 4-methyl-1,3-phenylene or (2,2,4-trimethyl)hexane. For example, R" is a group selected from the group consisting of —$CH_2$—,

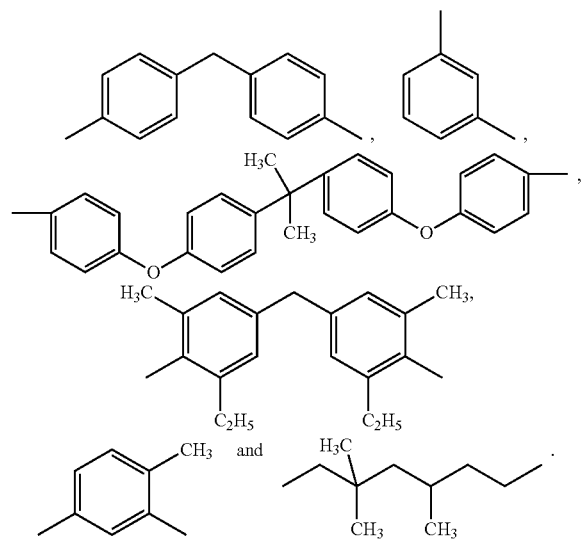

In some embodiments of the present invention, TAIC and/or BMI resin of formula (IV)

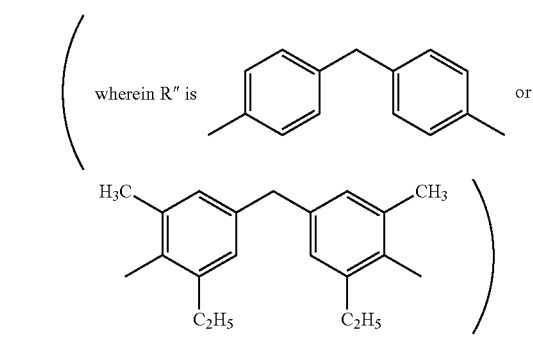

is used as a cross-linking agent. In addition, the weight ratio of the resin (a) to the cross-linking agent is generally from 6:1 to 1:1, preferably 4:1 to 1:1. If the ratio of the resin (a) to the cross-linking agent is too high (too few cross-linking agents), it may be difficult to further provide the desired cross-linking effect. If the amount of the cross-linking agent is too high, it may be difficult to maintain inherent excellent properties of the polyphenylene ether resin (a).

The resin composition of the present invention may optionally further comprise other additives, such as an elastomer, a catalyst, a hardening promoter, a flame retardant, a filler, a dispersing agent, a flexibilizer and the like, and those additives may be taken alone or in combination. An elastomer can be added to further improve the electrical properties and the physicochemical properties of a material. A catalyst can be added to promote the reaction involved. A filler can be added to improve the processability, heat resistance and/or moisture resistance of a material. A flame retardant can be added to increase the flame retardance of the prepared material. A hardening promoter can be added to improve the hardening effect. The elastomer may be selected from a group consisting of polybutadiene, polyisoprene, a styryl-containing polymer and combinations thereof, but is not limited thereto. The filler may be selected from a group consisting of silica, glass powder, talc, kaolin, pryan, mica, inorganic metal oxides (e.g., aluminum oxide, zirconium oxide) and combinations thereof, but is not limited thereto. The catalyst may be an organic peroxide selected from a group consisting of dicumyl peroxide (DCP), α,α'-bis(t-butylperoxy)diisopropyl benzene, benzoyl peroxide (BPO) and combinations thereof, but is not limited thereto. The flame retardant may be a phosphorus-containing flame retardant or a bromine-containing flame retardant (e.g., decabromobibenzyl ethane, DBDPE), but is not limited thereto. The hardening promoter may be a metallic salt compound having a structure of the following formula (V), but is not limited to,

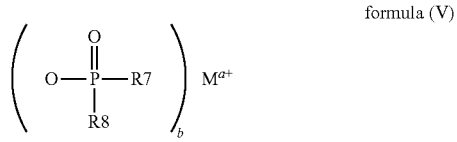

formula (V)

wherein, R7 and R8 are independently C1-C5 alkyl; $M^{a+}$ is a metal ion selected from the group consisting of $Al^{3+}$, $Zn^{2+}$, $Ca^{2+}$, $Ti^{4+}$, $Mg^{2+}$, $Sr^{2+}$, $Ba^{2+}$, $K^+$ and $Cu^{2+}$; and b is an integer from 1 to 4.

As for the amount of each of the additives, it is not particularly limited and can be adjusted depending on the needs by persons with ordinary skill in the art in accordance with their ordinary skill and disclosure of the present specification.

The resin composition of the present invention may be prepared into varnish form by evenly mixing the resin (a) and optional additive(s) through a stirrer and dissolving or dispersing the obtained mixture into the solvent (b) for subsequent applications.

The present invention further provides a prepreg which is obtained by adhering the abovementioned resin composition to a substrate (a reinforcing material) surface completely and drying the adhered substrate. A conventional reinforcing material includes a glass fiber cloth (a glass fabric, a glass paper, a glass mat, etc.), a kraft paper, a short fiber cotton paper, a nature fiber cloth, an organic fiber cloth, etc. In some embodiments of the present invention, 2116 glass fiber cloths are illustrated as the reinforcing materials, and the reinforcing material are heated and dried at 175° C. for 2 to 15 minutes (B-stage) to provide half-hardened prepregs.

The abovementioned prepregs can be used for manufacturing laminates. Thus, the present invention further provides a laminate comprising a synthetic layer and a metal layer, wherein the synthetic layer is made from the above prepregs. The laminate may be prepared by the following process: superimposing a plurality of prepregs and superimposing a metal foil (such as a copper foil) on at least one external surface of the superimposed prepregs to provide a superimposed object; performing a hot-pressing operation onto the superimposed object to obtain the laminate. Moreover, a printed circuit board can be obtained by further patterning the metal foil of the laminate.

The present invention will be further illustrated by the embodiments hereinafter, wherein the measuring instruments and methods are respectively as follows:

[Water Absorption Test]

The moisture resistance of the laminate is tested by pressure cooker test (PCT), i.e., subjecting the laminate into a pressure container (121° C., 100% R.H. and 1.2 atm) for 2 hours.

[Solder Resistance Test]

The solder resistance test is carried out by immersing the dried laminate in a solder bath at 288° C. for a while and observing whether there is any defect such as delamination and expansion.

[Peeling Strength Test]

Peeling strength refers to the bonding strength between a metal foil and a laminated prepreg, and which is usually expressed by the force required for vertically peeling the clad copper foil with a width of ⅛ inch from the surface of the laminated prepreg.

[Glass Transition Temperature (Tg) Test]

The glass transition temperature (Tg) is measured by using a Differential Scanning calorimeter (DSC), wherein the measuring methods are IPC-TM-650.2.4.25C and 24C testing method of the Institute for Interconnecting and Packaging Electronic Circuits (IPC).

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties.

[Dielectric Constant and Dissipation Factor Measurement]

Dk and Df are measured according to ASTM D150 under an operating frequency of 10 GHz.

EXAMPLE

Preparation of the Resin Composition

Example 1

According to the ratio shown in Table 1, resin (a) having a structure of the following formula (Ia), TAIC (available from Evonik Company) and bismaleimides (BMI, available from Daiwakasei Company) as the cross-linking agent, homopolymer of butadiene (trade name: Ricon 130, available from CRAY VALLEY Company) as the elastomer, benzoyl peroxide (available from Fluka Company) as the catalyst, decabromobibenzyl ethane (trade name: SAYTEX 8010, available from Albemarle Company) as the flame retardant, and silica powder (available from Denka Company) as the filler were mixed under room temperature with a stirrer for about 60 minutes followed by adding toluene and γ-butyrolactone (both available from Fluka Company) thereinto. After stirring the resultant mixture under room temperature for about 120 minutes, resin composition 1 was obtained.

formula (Ia)

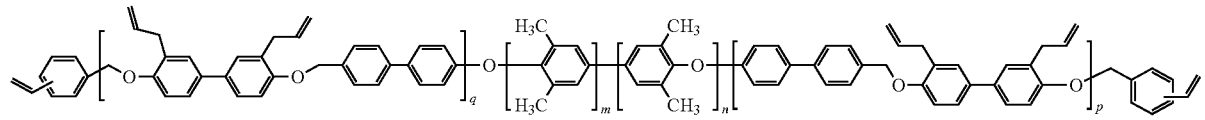

in formula (Ia), 20≤(m+n)≤25 and 1≤p+q<3.

Example 2

The preparation procedures of Example 1 were repeated to prepare resin composition 2, except that the cross-linking agent and the elastomer were not added and the amounts of other components were adjusted as shown in Table 1.

Example 3

The preparation procedures of Example 1 were repeated to prepare resin composition 3, except that the elastomer was not added and only TAIC was added as the cross-linking agent, a metallic salt compound (trade name: OP935, available from Clariant Company) was further added as the hardening promoter, and the amounts of other components were adjusted as shown in Table 1.

Example 4

The preparation procedures of Example 1 were repeated to prepare resin composition 4, except that the elastomer was not added and only BMI was added as the cross-linking agent, and the amounts of other components were adjusted as shown in Table 1.

Example 5

The preparation procedures of Example 1 were repeated to prepare resin composition 5, except that the cross-linking agent and the elastomer were not added, OP935 was further added as the hardening promoter, and the amounts of other components were adjusted as shown in Table 1.

Example 6

The preparation procedures of Example 2 were repeated to prepare resin composition 6, except that SPB100 (available from Otsuka Chemical Company) was added as the flame retardant, and the amount of the filler was adjusted as shown in Table 1.

Example 7

According to the ratio shown in Table 1, the resin (a), commercially available polyphenylene ether resin (aPPE, trade name: SA9000, available from Sabic Company), benzoyl peroxide (available from Fluka Company) as the catalyst, SAYTEX 8010 (trade name: SAYTEX 8010, available from Albemarle Company) as the flame retardant, and silica powder (available from Denka Company) as the filler were mixed under room temperature with a stirrer for about 60 minutes followed by adding toluene and γ-butyrolactone (both available from Fluka Company) thereinto. After stirring the resultant mixture under room temperature for about 120 minutes, resin composition 7 was obtained.

TABLE 1

| Parts by weight | | Example 1 | Example 2 | Example 3 | Example 4 | Example 5 | Example 6 | Example 7 |
|---|---|---|---|---|---|---|---|---|
| resin (a) | formula (Ia) | 60 | 60 | 60 | 60 | 60 | 60 | 40 |
| polyphenylene ether resin | aPPE (SA9000) | | | | | | | 20 |
| cross-linking agent | TAIC | 20 | | 10 | | | | |
| cross-linking agent | BMI | 10 | | | 10 | | | |
| elastomer | homopolymer of butadiene | 30 | | | | 10 | | |
| catalyst | peroxide | 0.5 | 0.1 | 0.1 | 0.1 | | 0.1 | 0.1 |
| hardening promoter | metallic salt compound OP935 | | | 0.1 | | 0.2 | | |
| flame retardant | SAYTEX 8010 | 23 | 12 | 14 | 14 | 14 | | 12 |
| | SPB100 | | | | | | 8 | |
| filler | silica powder | 45 | 22 | 24 | 24 | 25 | 21 | 22 |

[Preparation of the Laminate]

Laminates 1 to 7 were prepared using the resin compositions 1 to 7, respectively. In detail, one of the resin compositions was coated on 2116 reinforced glass fiber cloths by a roller. The coated 2116 reinforced glass fiber cloths were then placed in an oven and dried at 175° C. for 2 to 15 minutes to produce prepregs in a half-hardened state (resin content: about 63%). Four pieces of the prepregs were superimposed and two sheets of copper foil (0.5 oz.) were respectively superimposed on the two external surfaces of the superimposed prepregs to provide a superimposed object. A hot-pressing operation was performed on each of the prepared objects to provide the laminates 1 to 7 (corresponding to the resin compositions 1 to 7, respectively). Herein, the hot-pressing conditions are as follows: raising the temperature to about 200° C. to 220° C. with a heating rate of 2.0 to 3.0° C./min, and hot-pressing for 120 to 180 minutes under the full pressure of 15 kg/cm² (initial pressure is 8 kg/cm²) at said temperature.

The water absorption, solder resistance, peeling strength, glass transition temperature (Tg), flame retardance, dielectric constant (Dk), dissipation factor (Df) of laminates 1 to 7 were analyzed and the results are tabulated in Table 2.

TABLE 2

| | unit | laminate 1 | laminate 2 | laminate 3 | laminate 4 | laminate 5 | laminate 6 | laminate 7 |
|---|---|---|---|---|---|---|---|---|
| water absorption | % | 0.22 | 0.20 | 0.21 | 0.25 | 0.20 | 0.40 | 0.20 |
| solder resistance | minute | >10 | >10 | >10 | >10 | >10 | >10 | >10 |
| peeling strength | pound/inch | 3.85 | 3.82 | 3.70 | 3.75 | 3.90 | 3.60 | 3.84 |
| Tg | °C. | 206 | 193 | 188 | 210 | 183 | 182 | 191 |
| flame retardance | UL grade | V0 | V0 | V0 | V0 | V0 | V0 | V0 |
| Dk | 10 GHz | 3.82 | 3.86 | 3.85 | 3.88 | 3.84 | 3.89 | 3.84 |
| Df | 10 GHz | 0.0043 | 0.0046 | 0.0045 | 0.0051 | 0.0045 | 0.0049 | 0.0047 |

As shown in Table 2, the laminates 1 to 7 manufactured by using the resin compositions of the present invention are provided with satisfactory physicochemical properties and electrical properties (such as water absorption, flame retardance, Dk and Df), and outstanding heat resistance (high Tg and excellent solder resistance). Thus, the resin composition of the present invention can be used more extensively. In particular, the improvement in the dissipation factor (Df) of laminates 1 to 7 is extremely significant. For instance, Examples 2 and 6 manifest that outstanding excellent electrical properties can be achieved by using only the resin (a) without the presence of an additional crosslinking agent and elastomer. Moreover, the resin composition of the present invention using the resin (a) is low cost and has a good ease of processing, and is therefore very suitable for the manufacture of laminates. The production cost of laminates can be lowered and the production efficiency can be increased.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
   (a) a resin of formula (Ia):

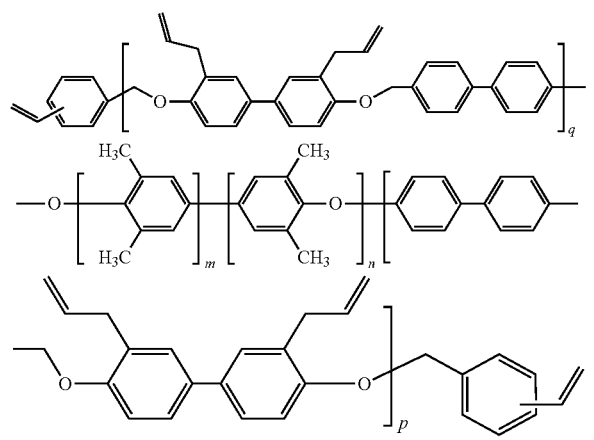

formula (Ia)

wherein,
   m and n are independently an integer, and $20 \leq (m+n) \leq 25$; and
   p and q are independently an integer, and $1 \leq p+q < 3$; and
   (b) a solvent.

2. The resin composition of claim 1, further comprising a cross-linking agent selected from the group consisting of triallyl isocyanurate (TAIC), bismaleimides having a structure of the following formula (IV) and combinations thereof,

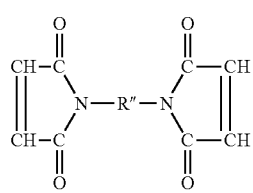

formula (IV)

wherein, R" is substituted or unsubstituted methylene, 4,4'-diphenylmethane, m-phenylene, bisphenol A diphenyl ether, 3,3'-dimethyl-5,5'-diethyl-4,4'-diphenyl methane, 4-methyl-1,3-phenylene or (2,2,4-trimethyl) hexane.

3. The resin composition of claim 2, wherein R" is selected from the group consisting of —$CH_2$—,

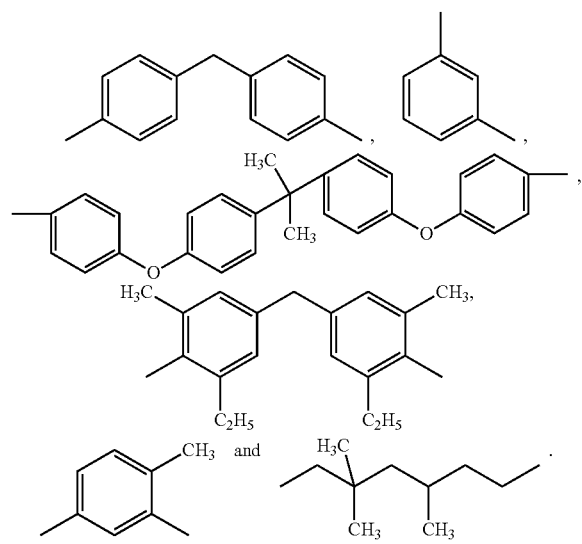

4. The resin composition of claim 1, wherein the solvent is selected from the group consisting of toluene, γ-butyrolactone, methyl ethyl ketone, cyclohexanone, butanone, acetone, xylene, methyl isobutyl ketone, N,N-dimethyl formamide (DMF), N,N-dimethyl acetamide (DMAc), N-methyl-pyrolidone (NMP) and combinations thereof.

5. The resin composition of claim 1, further comprising an additive selected from the group consisting of an elastomer, a catalyst, a hardening promoter, a flame retardant, a filler, a dispersing agent, a flexibilizer and combinations thereof.

6. The resin composition of claim 5, wherein the elastomer is selected from the group consisting of polybutadiene, polyisoprene, a styryl-containing polymer and combinations thereof.

7. The resin composition of claim 5, wherein the catalyst is an organic peroxide selected from the group consisting of dicumyl peroxide (DCP), α,α'-bis(t-butylperoxy)diisopropyl benzene, benzoyl peroxide (BPO) and combinations thereof.

8. The resin composition of claim 5, wherein the hardening promoter is a metallic salt compound having a structure of the following formula (V):

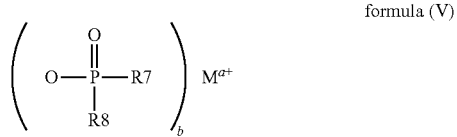

formula (V)

wherein,

R7 and R8 are independently C1-C5 alkyl;

$M^{a+}$ is a metal ion selected from the group consisting of $Al^{3+}$, $Zn^{2+}$, $Ca^{2+}$, $Ti^{4+}$, $Mg^{2+}$, $Sr^{2+}$, $Ba^{2+}$, $K^+$ and $Cu^{2+}$; and b is an integer from 1 to 4.

9. The resin composition of claim 5, wherein the flame retardant is a phosphorus-containing flame retardant or a bromine-containing flame retardant.

10. The resin composition of claim 5, wherein the filler is selected from the group consisting of silica, glass powder, talc, kaolin, pryan, mica, inorganic metal oxides and combinations thereof.

11. A prepreg, which is prepared by immersing a substrate into the resin composition of claim 1, and drying the immersed substrate.

12. A laminate, comprising a synthetic layer and a metal layer, wherein the synthetic layer is made from the prepreg of claim 11.

* * * * *